(12) United States Patent
Sutherland

(10) Patent No.: US 9,076,663 B2
(45) Date of Patent: Jul. 7, 2015

(54) DETERMINING SPACING USING A SPATIALLY VARYING CHARGE DISTRIBUTION

(75) Inventor: Ivan E. Sutherland, Portland, OR (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 907 days.

(21) Appl. No.: 13/253,893

(22) Filed: Oct. 5, 2011

(65) Prior Publication Data

US 2013/0088212 A1    Apr. 11, 2013

(51) Int. Cl.
| | |
|---|---|
| G01N 27/00 | (2006.01) |
| H01L 23/58 | (2006.01) |
| H01L 25/065 | (2006.01) |
| H01L 23/48 | (2006.01) |
| G01B 7/14 | (2006.01) |
| G01B 7/30 | (2006.01) |
| G01B 7/02 | (2006.01) |
| H01L 23/00 | (2006.01) |

(52) U.S. Cl.
CPC .............. *H01L 25/0657* (2013.01); *G01B 7/14* (2013.01); *G01B 7/30* (2013.01); *G01B 7/023* (2013.01); *H01L 23/48* (2013.01); *H01L 24/16* (2013.01); *H01L 2224/81121* (2013.01); *H01L 2225/06531* (2013.01); *H01L 2225/06593* (2013.01)

(58) Field of Classification Search
CPC ............. G01B 7/14; G01B 7/30; G01B 7/023
USPC ................................................... 324/662, 658
See application file for complete search history.

(56) References Cited

U.S. PATENT DOCUMENTS

| | | | |
|---|---|---|---|
| 6,916,719 B1 * | 7/2005 | Knight et al. ................. 438/381 |
| 7,786,427 B2 * | 8/2010 | Forrest et al. ............ 250/227.11 |
| 2004/0018654 A1 * | 1/2004 | Drost et al. ..................... 438/17 |
| 2004/0227221 A1 * | 11/2004 | Harris et al. ................... 257/686 |
| 2008/0061801 A1 * | 3/2008 | Chow et al. ................... 324/681 |
| 2008/0136424 A1 * | 6/2008 | Chow et al. ................... 324/662 |
| 2013/0080815 A1 * | 3/2013 | Sutherland ..................... 713/400 |
| 2013/0088212 A1 * | 4/2013 | Sutherland ................... 324/71.1 |
| 2013/0154608 A1 * | 6/2013 | Chow et al. .................. 324/71.1 |

* cited by examiner

*Primary Examiner* — Patrick Assouad
*Assistant Examiner* — Hoang X Nguyen
(74) *Attorney, Agent, or Firm* — Park, Vaughan, Fleming & Dowler LLP; Steven E. Stupp

(57) ABSTRACT

A semiconductor die is described. This semiconductor die includes a driver, and a spatial alignment transducer that is electrically coupled to the driver and which is proximate to a surface of the semiconductor die. The driver establishes a spatially varying electric charge distribution in at least one direction in the spatial alignment transducer, thereby facilitating determination of a vertical spacing between a surface of the semiconductor die and a surface of another semiconductor die. In particular, a spatial alignment sensor proximate to the surface of the other semiconductor die may detect an electrical field (or an associated electrostatic potential) associated with the spatially varying electric charge distribution. This detected electric field may allow the vertical spacing between the surfaces of the semiconductor dies to be determined.

12 Claims, 11 Drawing Sheets

DETERMINING SPACING USING A SPATIALLY VARYING CHARGE DISTRIBUTION

BACKGROUND

1. Field

The present disclosure generally relates to the design of a semiconductor die. More specifically, the present disclosure relates to a semiconductor die that includes a spatial alignment transducer with a spatially varying electric charge distribution that facilitates determining a spatial alignment between the semiconductor die and another semiconductor die.

2. Related Art

Proximity communication (PxC) is an input/output (I/O) technology that allows two face-to-face chips to communicate without wires. Although it promises much higher I/O density and lower power, chips that communicate using PxC typically must be well aligned so that signals are well coupled between the transmitting and receiving pads. If misalignment occurs, for example, at initial assembly or during system operation, channel crosstalk and potential bit errors can result.

Depending on the chip separation, a variety of techniques have been proposed to correct physical misalignment, including electronic alignment correction and by adaptation of the driving voltage levels. However, these techniques usually involve measuring the physical misalignment using on-chip position sensors.

However, determining the chip separation using on-chip position sensors often involves precision measurements. For example, determining the chip separation by measuring coupling capacitances typically involves precise measurements of very small currents in the nanoAmp range. These currents are comparable to transistor leakage currents, which can compromise measurement accuracy. Furthermore, this problem is expected to become progressively worse as critical dimensions are scaled to 90 nm and beyond, where the leakage currents can dominate the small signal currents, which may make it infeasible to extract the current signal. In addition, the leakage current varies with temperature, which makes it difficult to remove during a calibration process.

In principle, determining the chip separation by measuring voltages may be less prone to error due to leakage currents. However, to date this has proven extremely difficult. For example, while it is theoretically possible to infer the chip-to-chip coupling capacitance, and thus the chip-to-chip separation, from the voltage amplitude of a signal coupled from one chip to another, in practice this simple measurement is difficult because of the uncertainty in the parasitic capacitances on the receiving chip. In particular, the voltage amplitude measured on the receiving chip is $Vr=[Cc/(Cc+Cr)]\cdot Vt$, where $Vr$ and $Vt$ are, respectively, the received and transmitted signal amplitudes, $Cc$ is the chip-to-chip coupling capacitance, and $Cr$ is the parasitic capacitive load at the receiving node.

Hence, what is needed is a semiconductor die that facilitates determining chip alignment without the problems described above.

SUMMARY

One embodiment of the present disclosure provides a semiconductor die. This semiconductor die includes a driver, and a spatial alignment transducer electrically coupled to the driver and proximate to a surface of the semiconductor die. The driver establishes a spatially varying electric charge distribution in at least one direction in the spatial alignment transducer, thereby facilitating determination of a vertical spacing between a surface of the semiconductor die and a surface of another semiconductor die.

Note that the spatial alignment transducer may include an array of signal lines, and the driver may provide electrical signals having a common temporal frequency and different phases to the array of signal lines, thereby establishing the spatially varying electric charge distribution. In some embodiments, the driver establishes the spatially varying electric charge distribution in two directions in the spatial alignment transducer.

In some embodiments, the semiconductor die includes a spatial alignment sensor proximate to the surface that is configured to detect an electrical field associated with another spatially varying electric charge distribution, which is established by another spatial alignment transducer that is proximate to the surface of the other semiconductor die, thereby facilitating determination of the vertical spacing. Furthermore, the spatial alignment sensor may include an array of signal lines.

In some embodiments, the driver provides a temporal sequence of electrical signals during a time interval. Note that each electrical signal in the sequence has a duration, and that a given electrical signal in the sequence has a temporal frequency that is different than the temporal frequencies associated with the other electrical signals. For example, the driver may sequentially increase the temporal frequency during the time interval. Furthermore, changes to the temporal frequency may include continuous frequency increments and/or discrete frequency increments.

Another embodiment provides a system that includes the semiconductor die and the other semiconductor die. Moreover, the other semiconductor die may include a spatial alignment sensor proximate to a surface of the other semiconductor die. This spatial alignment sensor may detect an electrical field (or an associated electrical potential) associated with the spatially varying electric charge distribution, thereby facilitating determination of the vertical spacing between the surface of the semiconductor die and the surface of the other semiconductor die.

Another embodiment provides a method for determining the vertical spacing between the surface of the semiconductor die and the surface of the other semiconductor die. During this method, a driver establishes the spatially varying electric charge distribution in at least one direction in the spatial alignment transducer, which is proximate to the surface of the semiconductor die. Then, the spatial alignment sensor proximate to the surface of the other semiconductor die detects an electrical field (or an associated electrical potential) associated with the spatially varying electric charge distribution. In this way, the vertical spacing between the surface of the semiconductor die and the surface of the other semiconductor die can be determined.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a semiconductor die, a system that includes the semiconductor die and another semiconductor die, and a method for determining the spatial alignment between the two semiconductor dies are described. This semiconductor die includes a driver, and a spatial alignment transducer that is electrically coupled to the driver and which is proximate to a surface of the semiconductor die. The driver establishes a spatially varying electric charge distribution in at least one direction in the spatial alignment transducer, thereby facilitating determination of a spatial alignment between the semiconductor die and the other semiconductor die. In particular, a spatial alignment sensor proximate to the surface of the other semiconductor die may detect an electrical field (or an associated electrostatic potential) associated with the spatially varying electric charge distribution. This detected electric field may allow the vertical spacing between the surfaces of the semiconductor dies and/or an angular alignment of the semiconductor dies to be determined.

By facilitating low-cost and accurate determination of the alignment of the semiconductor dies, this alignment technique may enable on-chip determination and, if needed, remediation or elimination of misalignment. Thus, the alignment technique may facilitate high input/output (I/O) density, high bandwidth, low latency and low power communication using proximity communication (PxC).

Figure 1:
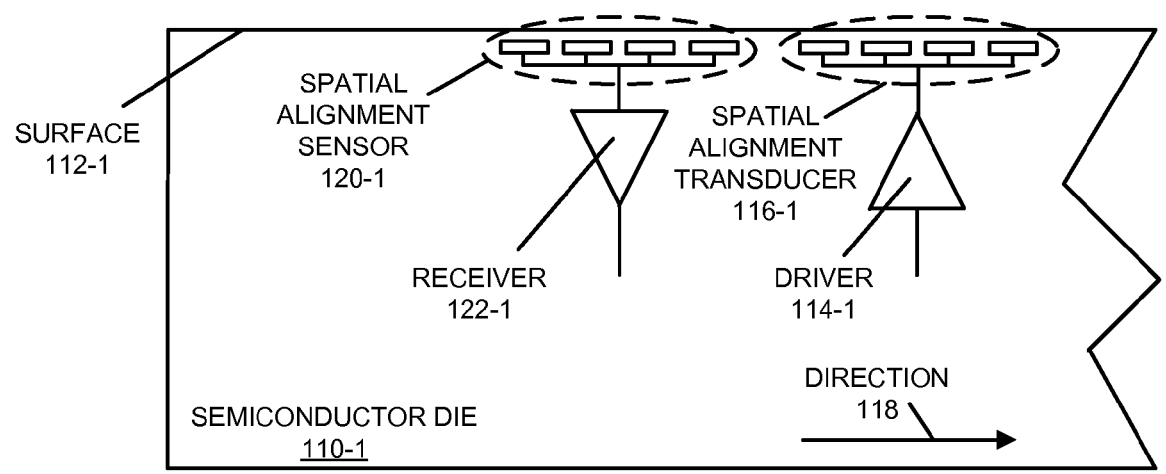
FIG. 1 is a block diagram illustrating a side view of a semiconductor die in accordance with an embodiment of the present disclosure.

We now describe embodiments of the semiconductor die and the system that includes the semiconductor die. FIG. 1 presents a block diagram illustrating a side view of a semiconductor die 110-1 (such as silicon). This semiconductor die includes a driver 114-1 and a spatial alignment transducer 116-1, which is electrically coupled to driver 114-1 and is proximate to a surface 112-1 of semiconductor die 110-1. Driver 114-1 may establish a spatially varying electric charge distribution in at least one direction 118 in spatial alignment transducer 116-1, thereby facilitating determination of a spatial alignment between semiconductor die 110-1 and another semiconductor die (such as semiconductor die 110-2 in FIG. 2).

Figure 2:
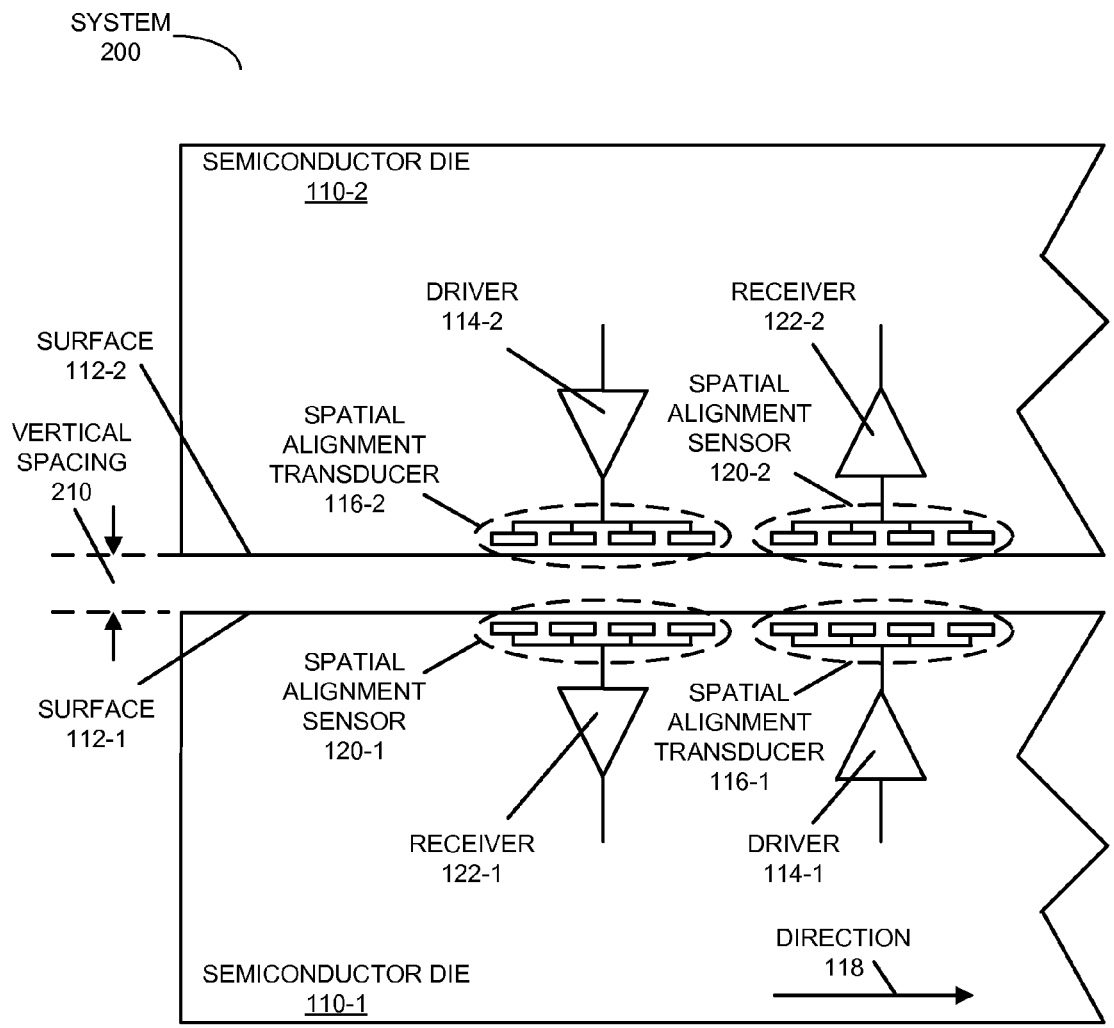
FIG. 2 is a block diagram illustrating a side view of a system that includes two semiconductor dies in accordance with an embodiment of the present disclosure.

In particular, the spatial alignment may be determined by detecting an electric field (or an associated electrical potential) associated with the spatially varying electric charge distribution. This is shown in FIG. 2, which presents a block diagram illustrating a side view of a system 200 that includes semiconductor die 110-1 and semiconductor die 110-2. Note that semiconductor die 110-2 includes a spatial alignment sensor 120-2 (such as an array of signal lines) proximate to a surface 112-2 of semiconductor die 110-2. This spatial alignment sensor (and possibly receiver 122-2) may detect the electrical field (or the associated electrical potential) associated with the spatially varying electric charge distribution, thereby facilitating determination of the spatial alignment between semiconductor dies 110. For example, because the electric field is a function of the spatial frequency of the spatially varying electric charge distribution and a vertical spacing 210 between surfaces 112 of semiconductor dies 110, spatial alignment transducer 116-1 and spatial alignment sensor 120-2 may facilitate determination of vertical spacing 210. Alternatively or additionally, spatial alignment transducer 116-1 and spatial alignment sensor 120-2 may facilitate determination of an angular alignment of semiconductor dies 110. As described further below with reference to FIG. 10, in some embodiments spatial alignment transducer 116-1 and spatial alignment sensor 120-2 may define a Vernier structure (such as Vernier structure 1000), and the angular alignment may be in the plane of surface 112-1 of semiconductor die 110-1.

Similarly, in some embodiments semiconductor die 110-2 includes a driver 114-2 and a spatial alignment transducer 116-2, which is electrically coupled to driver 114-2 and is proximate to a surface 112-2 of semiconductor die 110-2. Driver 114-2 may establish another spatially varying electric charge distribution in at least one direction 118 in spatial alignment transducer 116-2. The resulting electric field (or the associated electrical potential) may be detected by a spatial alignment sensor 120-1 (and possibly receiver 122-1) proximate to a surface 112-1 of semiconductor die 110-1, thereby facilitating determination of the spatial alignment between semiconductor dies 110.

By determining the spatial alignment, the alignment technique may facilitate reduction or elimination of misalignment, including the use of electronic alignment correction and by adaptation of the driving voltage levels during PxC. Thus, the alignment technique may facilitate PxC between at least partially overlapping PxC connectors or pads (not shown) on or proximate to surfaces 112. In some embodiments, communication between semiconductor dies 110 (and, more generally, between components in system 200 or between system 200 and an external device) may involve PxC of coupled signals, such as: communication of capacitively coupled signals (which is referred to as 'electrical proximity communication'), communication of electromagnetically coupled signals (which is referred to as 'electromagnetic proximity communication'), communication of optical signals (which is referred to as 'optical proximity communication'), communication of inductively coupled signals, and/or communication of conductively coupled signals. Note that, during optical proximity communication, vertical spacing 210 between semiconductor dies 110 may be less than or on the same order as a carrier wavelength of the optical signals.

Furthermore, in embodiments where electrical signals are communicated using PxC, the impedance of the associated PxC connectors or electrical contacts may be conductive and/or capacitive, i.e., may have a complex impedance that includes an in-phase component and/or an out-of-phase component. Regardless of the electrical contact mechanism (such as solder, microsprings, an anisotropic layer, etc.), if the impedance associated with the contacts is conductive, conventional transmit and receive I/O circuits (not shown) may be used in components in the embodiments of system 200. However, for contacts having a complex (and, possibly, variable) impedance, the transmit and receive I/O circuits may include one or more embodiments described in U.S. patent application Ser. No. 12/425,871, entitled "Receive Circuit for Connectors with Variable Complex Impedance," by Robert J. Drost et al., filed on Apr. 17, 2009, the contents of which are incorporated herein by reference.

We now further describe a technique for establishing the spatially varying electric charge distribution(s) in at least one direction 118 in spatial alignment transducer 116-1 and/or 116-2, and for determining the spatial alignment between semiconductor dies 110. In particular, the spatial alignment may be determined by modulating the spatial frequency of a set of electrical signals propagating along the plane or surface of a transmitting semiconductor die (such as surface 112-1 of semiconductor die 110-1), and then measuring the strength of the resulting electric field at a distance z at a receiving semiconductor die (such as semiconductor die 110-2). When the semiconductor dies 110 are close together (i.e., when z is small), the electric field has only a weak dependence on the spatial frequency of the electrical signals on the transmitting semiconductor die. This is because the electric field at the detector or sensor (such as spatial alignment sensor 120-2) is mostly influenced by the electric charge over a small area. However, when semiconductor dies 110 are far apart (i.e., when z is large), the electric field has a stronger dependence on the spatial frequency of the driving electric signals. Therefore, the electric field at the sensor is influenced by the charge over a larger area of the transmitting semiconductor die. By measuring the change in the electric field strength or magnitude in response to modulations in the spatial frequency of the driving electric signals, vertical spacing 210 can be determined.

Consider a one-dimensional line of charge with a spatially varying electric charge density (per unit length), the distribution of which is given by $$q(x) = q_0 \cdot \cos\left(\frac{2\pi x}{L}\right),$$

where $q_0$ is a constant representing the maximum charge density, x represents a location on the plane of the transmitting semiconductor die, and L is the spatial wavelength of the charge distribution. The differential vector electric field ($d\vec{E}$) induced by a differential section of charge (dq) in this plane at a distance r away is given by $$d\vec{E} = \frac{dq}{4\pi\varepsilon r^2} \cdot \hat{r},$$

where $\varepsilon$ is the permittivity of the medium.

Figure 3:
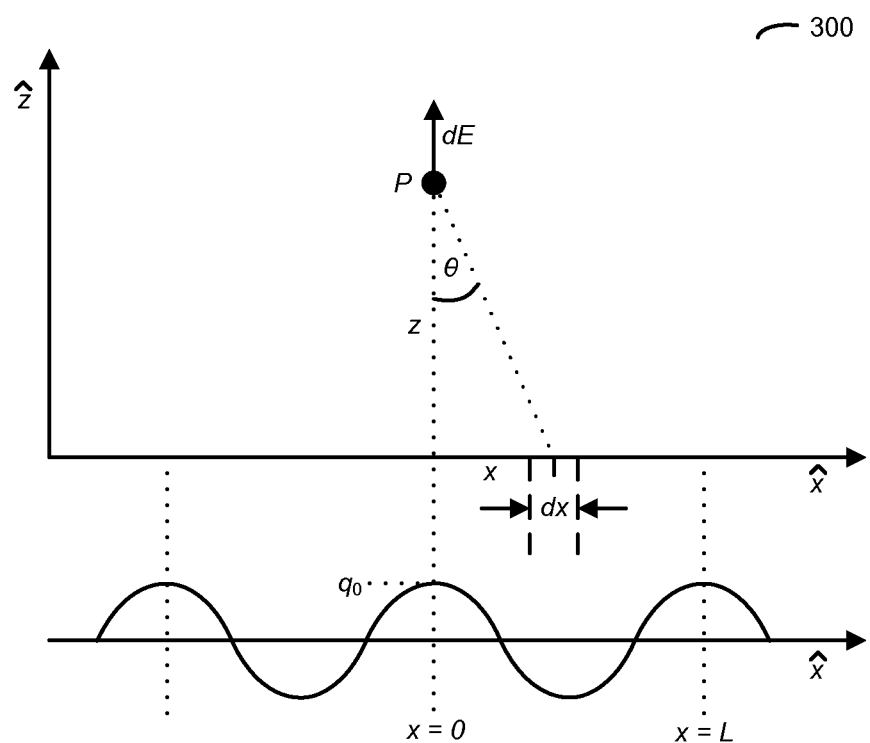
FIG. 3 is a drawing of the electric field associated with a spatially varying line of charge in accordance with an embodiment of the present disclosure.

As shown in FIG. 3, which presents a drawing 300 of the electric field associated with a spatially varying line of charge, for simplicity assume that the charge distribution is symmetric about an observation point P located at a distance z outside the plane of charge. The x-component of the induced electric field is then zero. Furthermore, the vector electric field induced by a differential charge of length dx at x is then given by $$d\vec{E} = |\vec{E}| \cdot \cos\theta \cdot \hat{z} = \frac{1}{4\pi\varepsilon} \cdot \frac{\cos\theta}{x^2 + z^2} \cdot q_0 \cdot \cos\left(\frac{2\pi x}{L}\right) \cdot dx \cdot \hat{z}$$

or $$d\vec{E} = \frac{1}{4\pi\varepsilon} \cdot \frac{1}{(x^2 + z^2)^{3/2}} \cdot q_0 \cdot \cos\left(\frac{2\pi x}{L}\right) \cdot dx \cdot \hat{z}.$$

The total vector electric field $\vec{E}$ can be found by integrating $d\vec{E}$ over the entire range of x over which the charge spans. For a set of discrete point charges, the vector electric field observed at point P is given by $$\vec{E} = \hat{z} \cdot \frac{q_t}{4\pi\varepsilon} \cdot \sum_x \frac{z}{(x^2 + z^2)^{3/2}} \cdot \cos\left(\frac{2\pi x}{L}\right).$$

where $q_t$ is the charge at each point.

Figure 4:
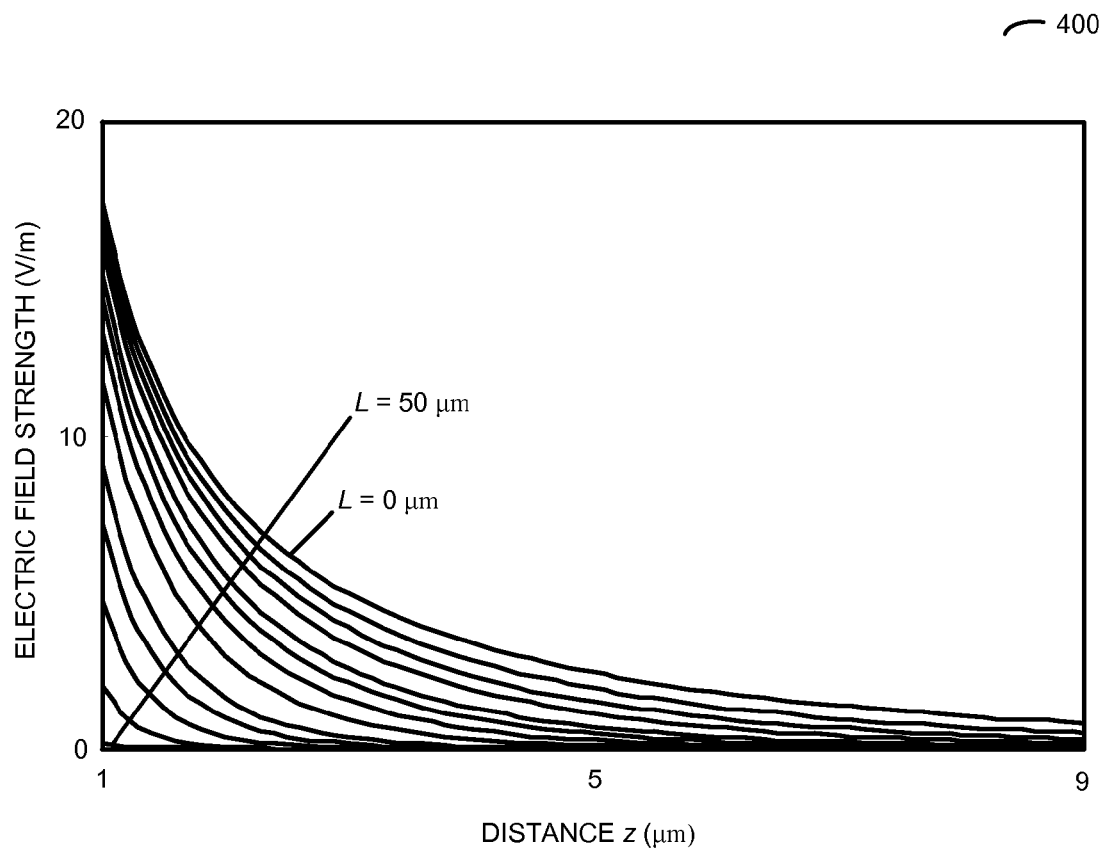
FIG. 4 is a graph of the electric field strength associated with a spatially varying line of charge as a function of the distance from the plane of the transmitting semiconductor die for various spatial wavelengths of the charge distribution in accordance with an embodiment of the present disclosure.

Assuming a charge density $q_0$ of 1 nC per μm, FIG. 4 presents a graph 400 of the electric field strength associated with a spatially varying line of charge at point P as a function of the distance (z) from the plane of the transmitting semiconductor die for various spatial wavelengths (L) of the spatially varying charge distribution. As expected, the observed electric field strength decreases with distance z. Moreover, the electric field strength also varies with the wavelength of the charge distribution. This phenomenon occurs because, when point P is near the plane, the electric field strength is mostly influenced by the charge in close proximity to point P. As point P moves away from the plane, parts of the plane further removed laterally make a stronger contribution to the electric field strength. In effect, the sample point can 'see' a larger section of the charge, and thus the waves of positive and negative charge tend to cancel each other.

Figure 5:
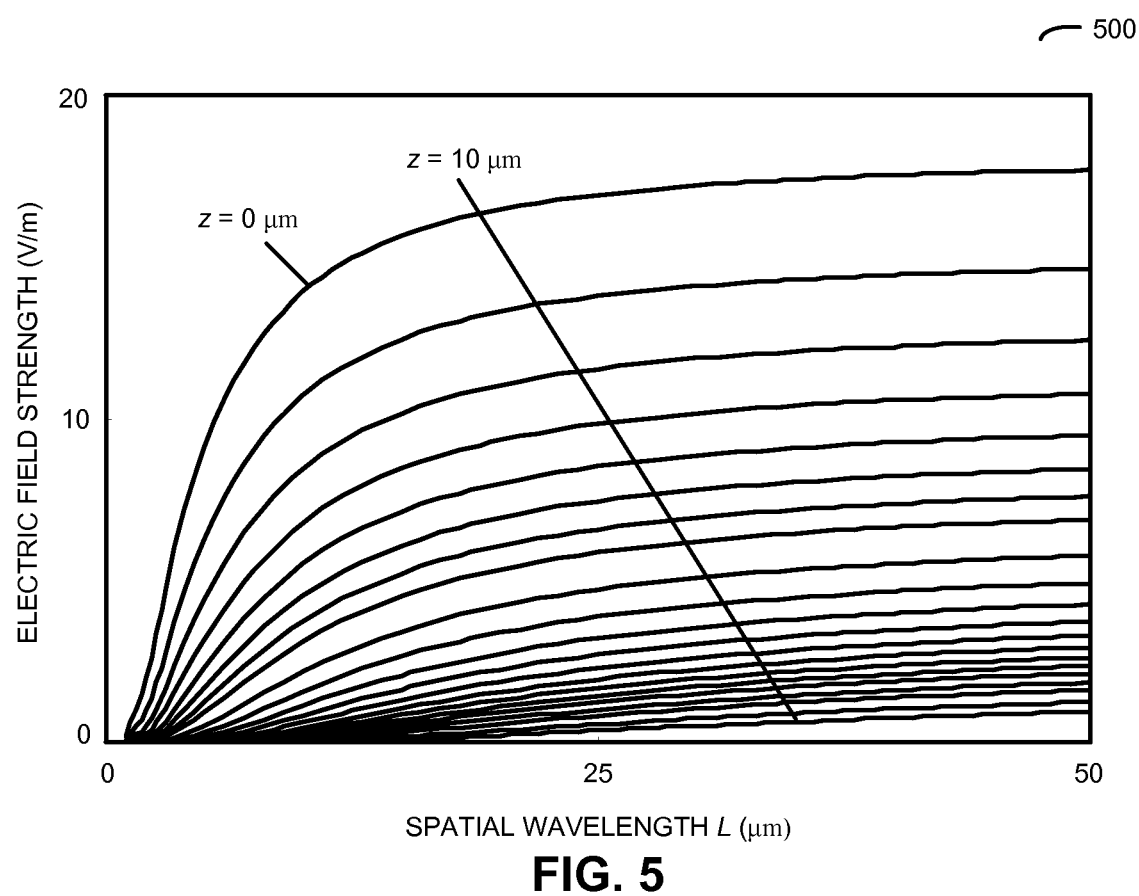
FIG. 5 is a graph of the electric field strength associated with a spatially varying line of charge as a function of the spatial wavelength of the charge distribution at various distances from the plane of the transmitting semiconductor die in accordance with an embodiment of the present disclosure.

Assuming, once again, a charge density $q_0$ of 1 nC per μm, FIG. 5 presents a graph 500 of the electric field strength associated with a spatially varying line of charge at point P as a function of the spatial wavelength (L) of the charge distribution at various distances (z) from the plane of the transmitting semiconductor die. This set of curves illustrates more clearly the dependence of the electric field strength on the spatial wavelength of the spatially varying charge distribution.

Figure 6:
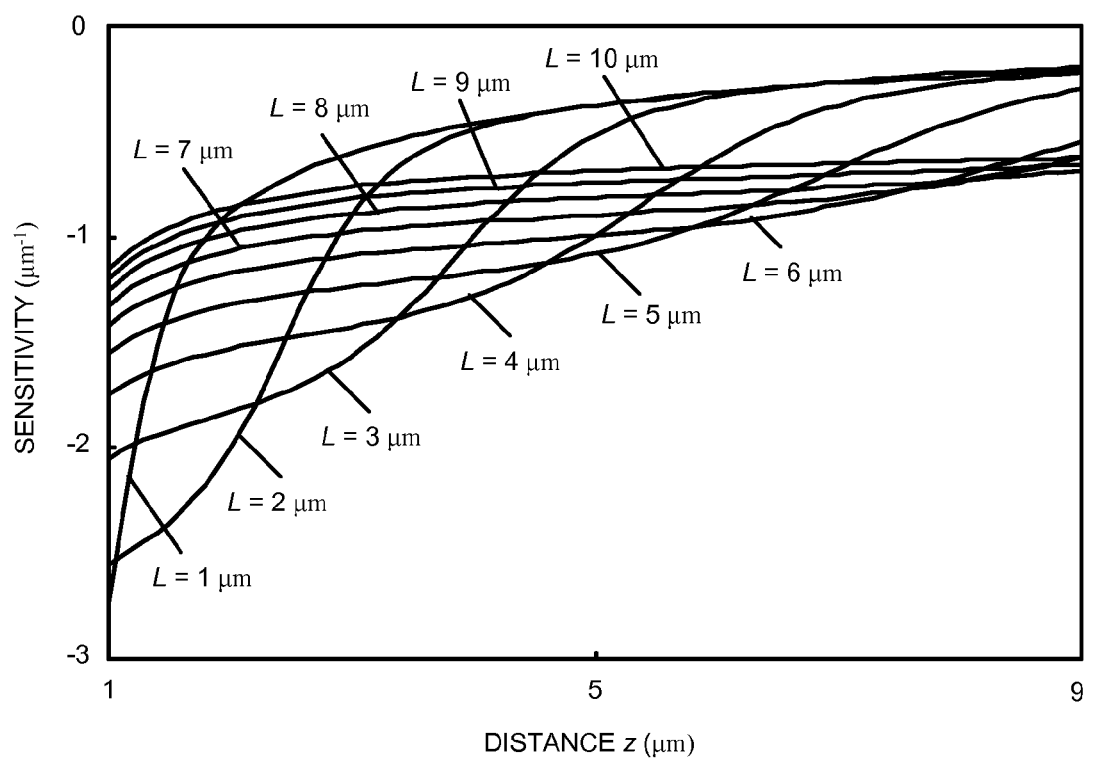
FIG. 6 is a graph of the sensitivity of the electric field strength as a function of the distance from the plane of the transmitting semiconductor die for various spatial wavelengths of the charge distribution in accordance with an embodiment of the present disclosure.

At a certain distance z, the sensitivity of the electric field strength varies with the spatial wavelength L of the charge distribution. This may facilitate measuring the distance z, as it is possible to optimize the sensitivity of the measurement by selecting an optimal range of spatial wavelengths. FIG. 6 presents a graph 600 of the sensitivity of the electric field strength as a function of the distance (z) from the plane of the transmitting semiconductor die for various spatial wavelengths (2) of the charge distribution. Note that, by defining sensitivity as (dE/dz)/E, at a particular distance z there exists a certain spatial wavelength that provides the highest sensitivity, so a measurement of z can be optimized by selecting an appropriate range of spatial wavelengths.

The dependence of the electric field strength on the periodicity of a spatially varying pattern of charge in a plane can be used to determine the separation (i.e., vertical spacing 210 in FIG. 2) between semiconductor dies 110. Suppose a spatial alignment transducer (such as spatial alignment transducer 116-1 in FIG. 1) includes a structure with parallel wires or signal lines that is defined on the top-level metal layer on a chip. For example, there may be 100 parallel wires spaced ($\Delta x$) on 1 µm centers, and each of these wires may be 100 µm long. This provides a structure having an area of approximately 100×100 µm². Note that other distances between the wires and different numbers of wires may be used. This may provide larger or smaller overall dimensions, including structures that are roughly square, rectangular, or even of arbitrary shape.

Furthermore, suppose that each wire is driven with a time-varying alternating voltage such that the voltage in each wire has a common temporal frequency but lags behind the voltage of its predecessor wire by a constant time ($\Delta t$), such as 100 ps. Therefore, the last wire in the parallel wires may lag behind the first wire by 100×100 ps or 10 ns. Once again, other delays between wires may also be used. These values are used merely for purposes of illustration.

Figure 7:
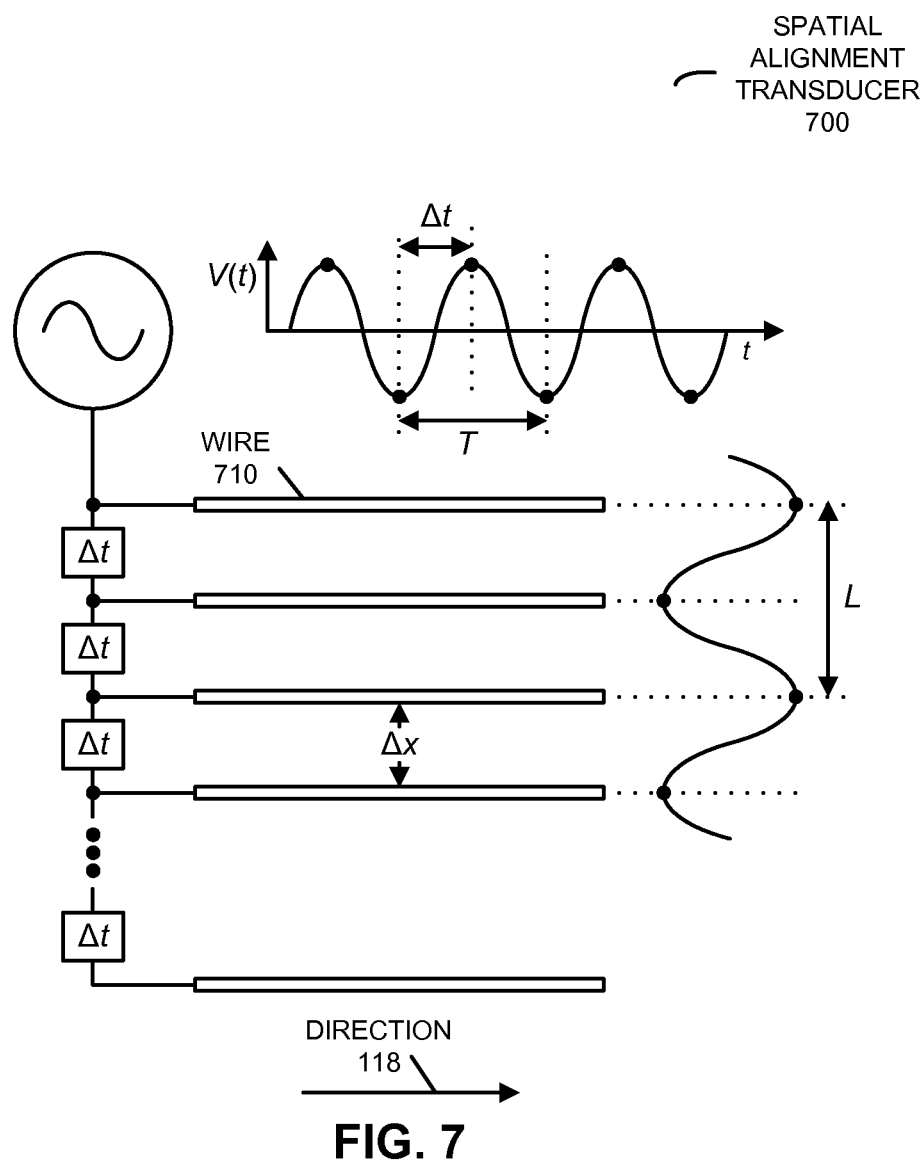
FIG. 7 is a block diagram of a spatial alignment transducer for creating a spatially varying charge distribution with a high spatial frequency in accordance with an embodiment of the present disclosure.

If an electrical signal with a temporal frequency of 5 GHz (or a period T of 200 ps) is driven into this structure, adjacent wires will be 180° out of phase. Consequently, the spatial wavelength (L) of the resulting charge on the wires will be 2 µm/cycle. This is shown in FIG. 7, which presents a block diagram of a spatial alignment transducer 700 (with wires, such as wire 710) for creating a spatially varying charge distribution with a high spatial frequency. In this example, $\Delta t$ equals 100 ps, $\Delta x$ equals 1 µm, T equals 200 ps and L equals 2 µm.

Figure 8:
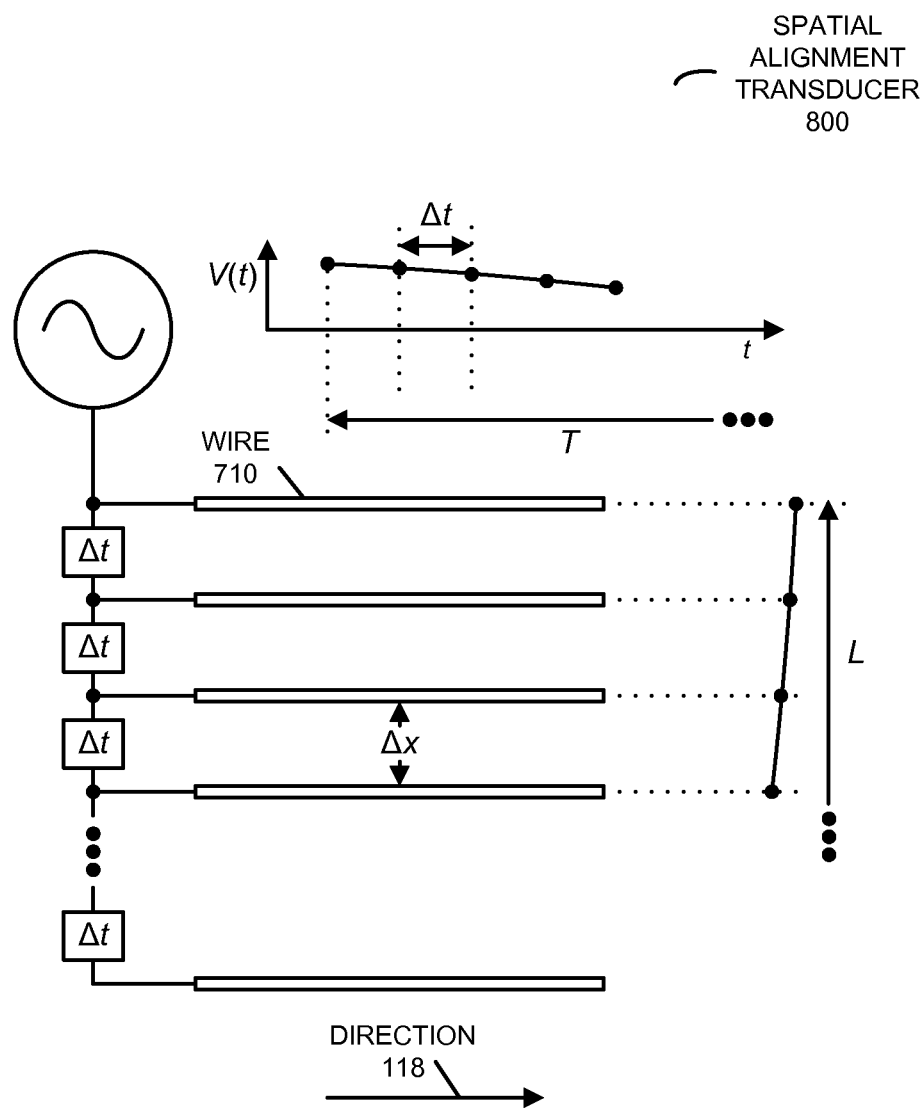
FIG. 8 is a block diagram of a spatial alignment transducer for creating a spatially varying charge distribution with a low spatial frequency in accordance with an embodiment of the present disclosure.

However, if an electrical signal with a temporal frequency of 1 MHz is driven into this structure, the signals on all the wires will be nearly in phase, because the temporal phase difference between adjacent wires (10 ns) is much smaller than the period T (1 µs) of the 1 MHz input. This is shown in FIG. 8, which presents a block diagram of a spatial alignment transducer 800 for creating a spatially varying charge distribution with a low spatial frequency. In this example, $\Delta t$ equals 100 ps, $\Delta x$ equals 1 µm, T equals 1 µs and L equals 0.01 m. For frequencies between 1 MHz and 5 GHz, the spatial wavelength (L) of the charge distribution is given by $$L = \frac{T}{\Delta t} \cdot \Delta x = \frac{1}{f \Delta t} \cdot \Delta x,$$

where f is the temporal frequency of the input electrical signal.

Note that the electric field strength measured at a distance away from the plane of the transmitting semiconductor die will be large if the structure is driven with a low-frequency input, and will fall off as the frequency of the input electric signal increases. In essence, a sensor out of the plane of the structure cannot sense the higher frequencies because its ability to distinguish separate wires in the structure blurs with distance.

A wide variety of sensors may be used to measure the electric field strength at different spatial frequencies. For example, a given one of spatial alignment sensors 120 (FIG. 2) may be similar to that of the aforementioned driving structure, with 100 wires that are each 100 µm long, and which are spaced on 1 µm centers. Each such wire may pick up a signal identical in form but differing in phase from that of its neighbors. For any fixed vertical spacing 210 (FIG. 2) of semiconductor dies 110 (FIG. 2), all of these sensors may detect smaller signals for a higher temporal driving frequency because the spatial wavelength of such signals in the driving structure is shorter. Similarly, these sensors may detect larger signals for a lower temporal driving frequency because the spatial wavelength of such signals is longer.

In some embodiments, the signals from the wires are added. However, because the phase of the received signal differs from wire to wire, the phase component may be removed prior to adding them. Those skilled in the art can devise a large number of electronic circuits for this purpose. For example, the received signals may be rectified so as to measure only their amplitude and not their phase. This may be accomplished using diodes. However, other non-linear elements may be used if the sum of any residual alternating portions of the received signals becomes essentially zero. Thus, one may input the 100 received signals to the gates of 100 transistors whose sources are connected to ground and which are biased to conduct only a small current when undriven. The current induced in such transistors may be a non-linear function of the alternating drive voltage picked up by the 100 receiving wires. Moreover, the resulting currents can be summed to obtain the desired output signal. Although the 100 transistors may vary in threshold voltage and transconductance, these variations are likely to partially cancel each other out because there are so many transistors involved. Furthermore, such variations may have very similar effects on both high and low temporal frequency signals.

Those skilled in the art will recognize that inserting a 5 GHz signal onto a semiconductor die (such as an integrated circuit chip) may be difficult. However, generating such a signal in the semiconductor die may be easier. Therefore, in some embodiments an on-chip oscillator is used to provide the driving signal. Furthermore, a counter, or other suitable component(s), can divide the temporal frequency into lower harmonic frequencies as needed. For example, the highest temporal frequency may be divided by two, by three, and so on, in as many increments as are needed in order to obtain a satisfactory measurement of vertical spacing 210 (FIG. 2).

Figure 9:
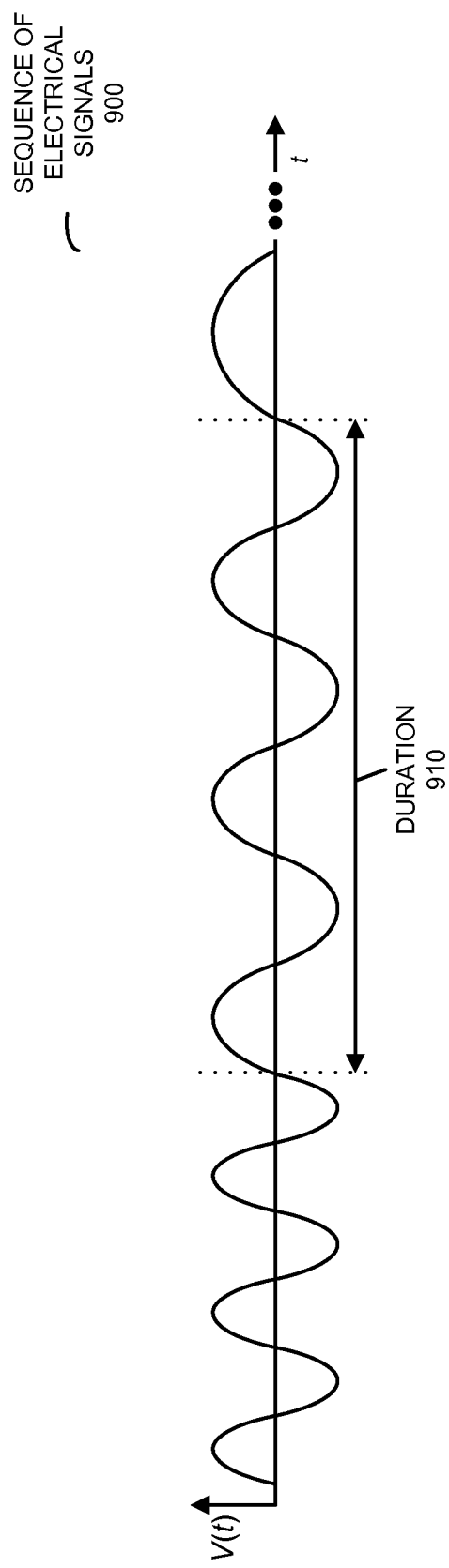
FIG. 9 is a timing diagram illustrating a temporal sequence of electrical signals in accordance with an embodiment of the present disclosure.

Note that a driver (such as driver 114-1 in FIG. 1) may provide a temporal sequence of electrical signals with such temporal frequencies during a time interval. This is shown in FIG. 9, which presents a timing diagram illustrating a temporal sequence of electrical signals 900. Note that each electrical signal in sequence of electrical signals 900 has a duration, such as duration 910 (which may be fixed or, as shown in FIG. 9, may correspond to a given number of cycles), and that a given electrical signal in sequence 900 has a temporal frequency that is different than the temporal frequencies associated with the other electrical signals. For example, driver 114-1 (FIG. 1) may sequentially increase or decrease the temporal frequency during the time interval. (However, in other embodiments the frequency changes may not be monotonic.) Furthermore, changes to the temporal frequency may include continuous frequency increments and/or discrete frequency increments. By varying the temporal frequency (and, thus, the spatial frequency) during the time interval, the sensitivity of the sensor may be systematically varied, which may allow vertical spacing 210 (FIG. 2) to be bracketed or to be defined based on a sensitivity threshold.

Stated differently, a signal with a given temporal frequency may be applied on the transmitting semiconductor die and a corresponding current or voltage may be measured on the receiving semiconductor die. Then, as the temporal frequency is varied at constant amplitude, changes to the received signal are measured. In particular, as the driving temporal frequency is reduced, the sensor is better able to detect the changing voltage of nearby drive wires because the phase of signals on these wires will be more similar. At some point, decreasing the driving temporal frequency further does not further increase the output signal. The spatial wavelength of the signal induced at this temporal frequency is a measure of vertical spacing 210 (FIG. 2).

In an exemplary embodiment, each temporal frequency may drive the spatial alignment transducer for 100 μs before giving way to the next. Suppose there are 20 such temporal driving frequencies. At the sensor, this driving pattern may produce a slowly varying output voltage with a pattern that repeats every 2000 μs. The output pattern may exhibit 20 voltage increments, each lasting 100 μs. By detecting which of the increments are well separated in the output voltage and which are nearly the same, vertical spacing 210 (FIG. 2) may be identified as the location in the sequence where the output voltage changes little.

Figure 10:
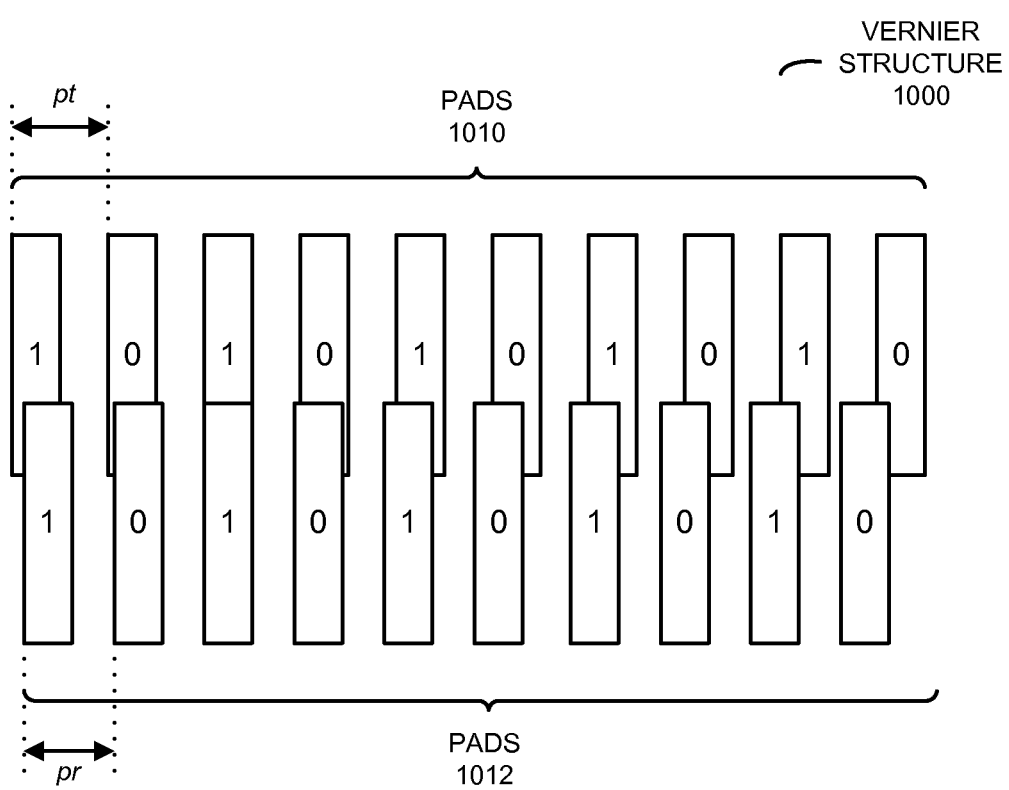
FIG. 10 is a block diagram of a Vernier structure to measure in-plane alignment in accordance with an embodiment of the present disclosure.

In the preceding discussion, a technique for creating a spatially varying pattern of charge from a series of correlated time-varying signals has been described. This spatially varying charge was then used to measure the distance between an observation point and the plane of charge. However, the underlying phenomenon of spatially varying charge patterns can be used for other purposes, such as measuring in-plane alignment between two semiconductor dies. For example, this technique may be used in conjunction with a Vernier structure (thereby making the Vernier structure configurable) to measure in-plane misalignment. This is shown in FIG. 10, which presents a block diagram of a Vernier structure 1000. In particular, a series of alternating signals may be applied on a set of elongated transmitting pads 1010 placed on a fixed pitch pt in the transmitting semiconductor die. The receiving semiconductor die has a similar set of pads 1012, except that they are placed on a pitch pr that is slightly different than that of transmitting pads 1010. Note that, if the transmitting and receiving bar pitches were the same, the receiving semiconductor die would observe the same transmitted alternating pattern. However, the difference in pitch results in a break in the alternating pattern, and the location of this breakpoint indicates the relative in-plane misalignment between the two semiconductor dies along one direction. Similar sets of pads placed orthogonally can determine the in-plane misalignment along another direction. Note that the resolution may be equal to twice the difference in bar pitch ($\Delta p = pr - pt$). Furthermore, because the bars can be lithographically defined, this difference can be controlled with submicron accuracy.

In some embodiments, the alignment technique is implemented using a plane of spatially varying charge distribution to construct Vernier structures with different spatial frequencies by varying the temporal frequency of the input signal. This approach may allow a single structure to measure both vertical spacing 210 (FIG. 2) and in-plane misalignment.

Figure 11:
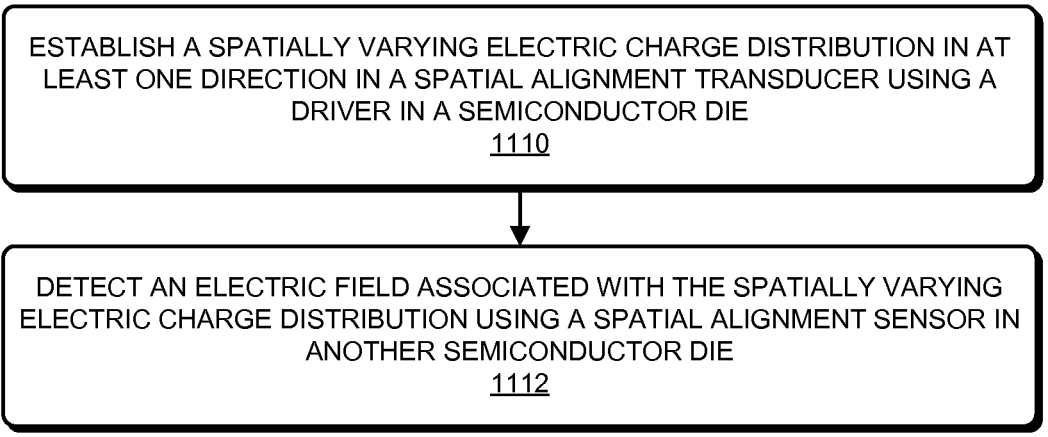
FIG. 11 is a flow diagram illustrating a method for determining the spatial alignment between a semiconductor die and another semiconductor die in accordance with an embodiment of the present disclosure.

We now describe embodiments of the method. FIG. 11 presents a flow diagram illustrating a method 1100 for determining the spatial alignment between a semiconductor die and another semiconductor die. During this method, a driver establishes a spatially varying electric charge distribution in at least one direction in a spatial alignment transducer (operation 1110), which is proximate to a surface of the semiconductor die. Then, a spatial alignment sensor proximate to a surface of the other semiconductor die detects an electrical field (or an associated electrical potential) associated with the spatially varying electric charge distribution (operation 1112). In this way, the spatial alignment between the semiconductor die and the other semiconductor die can be determined.

In some embodiments of method 1100 there may be additional or fewer operations. Moreover, the order of the operations may be changed, and/or two or more operations may be combined into a single operation.

System 200 may include a device or a system, such as: a VLSI circuit, a switch, a hub, a bridge, a router, a communication system, a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Note that a given computer system may be at one location or may be distributed over multiple, geographically dispersed locations.

Semiconductor die 110-1 (FIG. 1), system 200 (FIG. 2), spatial alignment transducer 700 (FIG. 7), spatial alignment transducer 800 (FIG. 8), and Vernier structure 1000 (FIG. 10) may include fewer components or additional components. For example, the wires (such as wire 710) in spatial alignment transducer 700 (FIG. 7) may be defined in two groups in two orthogonal directions, and these wires may be driven with a common temporal frequency but different phases in order to establish the spatially varying electric charge distribution in two directions (as opposed to just along direction 118 in FIG. 1).

Moreover, although these devices and systems are illustrated as having a number of discrete items, these embodiments are intended to be functional descriptions of the various features that may be present rather than structural schematics of the embodiments described herein. Consequently, in these embodiments two or more components may be combined into a single component and/or a position of one or more components may be changed. In addition, functionality in the preceding embodiments may be implemented more in hardware and less in software, or less in hardware and more in software, as is known in the art.

While the preceding embodiments use semiconductor dies (such as silicon) in the chip package, in other embodiments a different material than a semiconductor may be used as the substrate material in one or more of these chips. However, in embodiments in which silicon is used, the semiconductor dies may be fabricated using standard silicon processing. These semiconductor dies may provide silicon area that supports logic and/or memory functionality.

Furthermore, while the preceding embodiments illustrate particular configurations of system 200 (FIG. 2), a number of techniques and configurations may be used to implement mechanical alignment of components. For example, semiconductor dies 110 (FIG. 2) may be positioned relative to each other using a ball-and-pit alignment technique (and, more generally, a positive-feature-in-negative-feature alignment technique). In particular, balls may be positioned into etch pits to mechanically couple and relatively align semiconductor dies 110 in system 200 (FIG. 2). In other embodiments, a variety of positive features may be used, such as hemisphere-shaped bumps. Thus, in general, a combination of mechanically locking positive and negative surface features on components in system 200 (FIG. 2) may be used to align and/or assemble system 200 (FIG. 2).

Note that packaging techniques that allow some rework are more cost-effective when faced with lower semiconductor-die yields or high expense to test extensively before packaging and assembly. Therefore, in embodiments where the mechanical, optical and/or electrical coupling between semiconductor dies 110 (FIG. 2) is remateable, the yield of system 200 (FIG. 2) may be increased by allowing rework (such as replacing a bad chip that is identified during assembly, testing or burn-in). In this regard, remateable mechanical, optical and/or electrical coupling should be understood to be mechanical, optical or electrical coupling that can be established and broken repeatedly (i.e., two or more times) without requiring rework or heating (such as with solder). In some embodiments, the remateable mechanical, optical and/or electrical coupling involves male and female components designed to couple to each other (such as components that snap together).

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A semiconductor die, comprising:
   a driver, wherein the driver is configured to provide a temporal sequence of electrical signals during a time interval;
   wherein each electrical signal in the sequence has a duration;
   wherein a given electrical signal in the sequence has a temporal frequency that is different than the temporal frequencies associated with the other electrical signals, and
   wherein the driver is configured to sequentially increase the temporal frequency during the time interval using discrete frequency increments; and
   a spatial alignment transducer electrically coupled to the driver, wherein the spatial alignment transducer is proximate to a surface of the semiconductor die, and wherein the driver is configured to establish a spatially varying electric charge distribution in at least one direction in the spatial alignment transducer, thereby facilitating determination of a vertical spacing between the surface of the semiconductor die and a surface of another semiconductor die.

2. The semiconductor die of claim 1, wherein the driver is configured to establish the spatially varying electric charge distribution in two directions in the spatial alignment transducer.

3. The semiconductor die of claim 1, wherein the spatial alignment transducer includes an array of signal lines; and wherein the driver is configured to provide electrical signals having a common temporal frequency and different phases to the array of signal lines, thereby establishing the spatially varying electric charge distribution.

4. The semiconductor die of claim 1, wherein the semiconductor die further includes a spatial alignment sensor proximate to the surface of the semiconductor die that is configured to detect an electrical field associated with another spatially varying electric charge distribution, which is established by another spatial alignment transducer that is proximate to the surface of the other semiconductor die, thereby facilitating determination of the vertical spacing between the semiconductor die and the other semiconductor die.

5. The semiconductor die of claim 4, wherein the spatial alignment sensor includes an array of signal lines.

6. A system, comprising:
   a first semiconductor die, wherein the first semiconductor die includes:
   a driver, wherein the driver is configured to provide a temporal sequence of electrical signals during a time interval;
   wherein each electrical signal in the sequence has a duration;
   wherein a given electrical signal in the sequence has a temporal frequency that is different than the temporal frequencies associated with the other electrical signals, and
   wherein the driver is configured to sequentially increase the temporal frequency during the time interval using discrete frequency increments; and
   a spatial alignment transducer electrically coupled to the driver, wherein the spatial alignment transducer is proximate to a surface of the first semiconductor die, and wherein the driver is configured to establish a spatially varying electric charge distribution in at least one direction in the spatial alignment transducer; and
   a second semiconductor die, wherein the second semiconductor die includes a spatial alignment sensor proximate to a surface of the second semiconductor die, wherein the spatial alignment sensor is configured to detect an electrical field associated with the spatially varying electric charge distribution, thereby facilitating determination of a vertical spacing between the surface of the first semiconductor die and the surface of the second semiconductor die.

7. The system of claim 6, wherein the driver is configured to establish the spatially varying electric charge distribution in two directions in the spatial alignment transducer.

8. The system of claim 6, wherein the spatial alignment transducer includes an array of signal lines; and
   wherein the driver is configured to provide electrical signals having a common temporal frequency and different phases to the array of signal lines, thereby establishing the spatially varying electric charge distribution.

9. The system of claim 6, wherein the spatial alignment sensor includes an array of signal lines.

10. A method for determining a vertical spacing between a surface of a first semiconductor die and a surface of a second semiconductor die, comprising:
    establishing a spatially varying electric charge distribution in at least one direction in a spatial alignment transducer, which is proximate to the surface of the first semiconductor die;
    providing a temporal sequence of electrical signals during a time interval using a driver electrically coupled to the spatial alignment transducer, wherein each electrical signal in the sequence has a duration, wherein a given electrical signal in the sequence has a temporal frequency that is different than the temporal frequencies associated with the other electrical signals, and wherein the temporal frequency was sequentially increased during the time interval using discrete frequency increments; and detecting an electrical field associated with the spatially varying electric charge distribution using a spatial alignment sensor proximate to the surface of the second semiconductor die, thereby facilitating determination of the vertical spacing between the surface of the first semiconductor die and the surface of the second semiconductor die.

11. The method of claim 10, wherein the spatially varying electric charge distribution is established in two directions in the spatial alignment transducer.

12. The method of claim 10, wherein the spatial alignment transducer includes an array of signal lines; and wherein establishing the spatially varying charge distribution involves providing electrical signals having a common temporal frequency and different phases to the array of signal lines.

\* \* \* \* \*

UNITED STATES PATENT AND TRADEMARK OFFICE
CERTIFICATE OF CORRECTION

PATENT NO. : 9,076,663 B2  
APPLICATION NO. : 13/253893  
DATED : July 7, 2015  
INVENTOR(S) : Sutherland Page 1 of 1

It is certified that error appears in the above-identified patent and that said Letters Patent is hereby corrected as shown below:

In The Specification

In column 7, line 1, delete "(2)" and insert -- ($\lambda$) --, therefor.

Signed and Sealed this  
Fifteenth Day of March, 2016

Michelle K. Lee  
*Director of the United States Patent and Trademark Office*